United States Patent
Su et al.

(10) Patent No.: US 11,496,130 B2
(45) Date of Patent: Nov. 8, 2022

(54) RADIO FREQUENCY SWITCH CIRCUIT AND METHOD FOR CONTROLLING CIRCUIT

(71) Applicant: SMARTER MICROELECTRONICS (GUANG ZHOU) CO., LTD., Guangzhou (CN)

(72) Inventors: Qiang Su, Guangzhou (CN); Xin Zhang, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 55 days.

(21) Appl. No.: 16/953,268

(22) Filed: Nov. 19, 2020

(65) Prior Publication Data
US 2021/0226622 A1 Jul. 22, 2021

Related U.S. Application Data

(63) Continuation of application No. PCT/CN2020/111245, filed on Aug. 26, 2020.

(51) Int. Cl.
| | |
|---|---|
| H03K 17/68 | (2006.01) |
| H03K 17/687 | (2006.01) |
| H03F 3/24 | (2006.01) |
| H03F 3/195 | (2006.01) |
| H03K 17/76 | (2006.01) |

(52) U.S. Cl.
CPC ........... *H03K 17/687* (2013.01); *H03F 3/195* (2013.01); *H03F 3/24* (2013.01); *H03K 17/76* (2013.01); *H03F 2200/165* (2013.01)

(58) Field of Classification Search
CPC ...... H03K 17/687; H03K 17/76; H03F 3/195; H03F 3/24; H03F 2200/165
See application file for complete search history.

(56) References Cited

U.S. PATENT DOCUMENTS

| | | | | |
|---|---|---|---|---|
| 2012/0252377 A1* | 10/2012 | Wachi | ................. | H03K 17/002 455/83 |
| 2013/0052968 A1* | 2/2013 | Popplewell | ........... | H02M 3/073 455/78 |
| 2016/0094207 A1* | 3/2016 | Crandall | ................. | H02M 3/07 327/333 |
| 2017/0237424 A1* | 8/2017 | Wilz | .............. | H03K 19/018507 327/384 |

(Continued)

*Primary Examiner* — Junpeng Chen
(74) *Attorney, Agent, or Firm* — Syncoda LLC; Feng Ma

(57) ABSTRACT

A radio frequency switch circuit includes a negative voltage generating circuit, a notch network, a logic control circuit, and a radio frequency switching circuit. The logic control circuit can be configured to, upon being driven by the negative voltage signal generated by the negative voltage generating circuit, control the operating modes of the radio frequency switching circuit; and the notch network is connected between the negative voltage generating circuit and the logic control circuit. As such, the influence of radio frequency signals generated by the radio frequency switching circuit can be filtered through the notch network, and the interference of radio frequency signals to the negative voltage generating circuit can be reduced, thereby improving the performance of the radio frequency switch circuit, for example in insertion loss, isolation and harmonic suppression.

18 Claims, 5 Drawing Sheets

(56) References Cited

U.S. PATENT DOCUMENTS

2018/0234095 A1* 8/2018 Balteanu .......... H03K 3/356113
2019/0273490 A1* 9/2019 Aubain ................ H03K 17/102
2021/0115553 A1* 4/2021 Abraham ............ H01L 21/2855

* cited by examiner

RADIO FREQUENCY SWITCH CIRCUIT AND METHOD FOR CONTROLLING CIRCUIT

CROSS-REFERENCE TO RELATED APPLICATIONS

This application is a continuation of International Application No. PCT/CN2020/111245 filed on Aug. 26, 2020, which claims priority to Chinese Patent Application No. 202010060699.6 filed on Jan. 19, 2020. The disclosures of these applications are hereby incorporated by reference in their entirety.

BACKGROUND

With the advent of the 5th-Generation (5G) mobile communication technology, the communication frequency bands of mobile communication are increasing, while the range of communication frequencies is also increasing. In a radio frequency front-end system, not only higher requirements are put forward for multi-frequency and multi-mode power amplifiers, but also it is a great challenge to improve the performance of radio frequency switch circuits.

SUMMARY

The disclosure relates generally to wireless communication technologies, and more specifically to a radio frequency (RF) switch circuit and a method for controlling circuit.

Various embodiments of the present disclosure can improve the performance of the radio frequency switch circuit, and provide a radio frequency switch circuit and a method for controlling circuit.

The radio frequency switch circuit can filter the influence of radio frequency signals generated by the radio frequency switch by means of a notch network, reduce the interference of radio frequency signals to a negative voltage generating circuit, thereby improving the performance of the radio frequency switch circuit such as insertion loss, isolation and harmonic suppression.

Various embodiments of the disclosure provide a radio frequency switch circuit, which includes a negative voltage generating circuit, a notch network, a logic control circuit and a radio frequency switching circuit; in some embodiments the logic control circuit is configured to, upon being driven by the negative voltage signal generated by the negative voltage generating circuit, control the operating modes of the radio frequency switching circuit; and The notch network is connected between the negative voltage generating circuit and the logic control circuit.

In some embodiments of the disclosure, the notch network includes a first LC series resonant loop, and the resonant point of the first LC series resonant loop is set according to the fundamental operating frequency of the radio frequency switch circuit; and One end of the first LC series resonant loop is connected to a common node between the negative voltage generating circuit and the logic control circuit, and the other end of the first LC series resonant loop is grounded.

In some embodiments of the disclosure, the resonant point of the first LC series resonant loop is equal to the fundamental operating frequency of the radio frequency switch circuit.

In some embodiments of the disclosure, the notch network includes a first LC parallel resonant loop, and the resonant point of the first LC parallel resonant loop is set according to the fundamental operating frequency of the radio frequency switch circuit; and One end of the first LC parallel resonant loop is connected to the output end of the negative voltage generating circuit, and the other end of the first LC parallel resonant loop is connected to the input end of the logic control circuit.

In some embodiments of the disclosure, the resonant point of the first LC parallel resonant loop is equal to the fundamental operating frequency of the radio frequency switch circuit.

In some embodiments of the disclosure, the notch network further includes a second LC series resonant loop to an $N^{th}$ LC series resonant loop, where N is an integer greater than or equal to 2; and when i is taken from 2 to N, the resonant point of the $i^{th}$ LC series resonant loop is set according to the $i^{th}$ harmonic frequency of the radio frequency switch circuit; and One end of the $i^{th}$ LC series resonant loop is connected to a common node between the negative voltage generating circuit and the logic control circuit, and the other end of the $i^{th}$ LC series resonant loop is grounded.

In some embodiments of the disclosure, when i is taken from 2 to N, the resonant point of the $i^{th}$ LC series resonant loop is equal to the $i^{th}$ harmonic frequency of the radio frequency switch circuit.

In some embodiments of the disclosure, the notch network further includes a second LC parallel resonant loop to an $M^{th}$ LC parallel resonant loop, where M is an integer greater than or equal to 2; and when i is taken from 2 to M, the resonant point of the $i^{th}$ LC parallel resonant loop is set according to the $i^{th}$ harmonic frequency of the radio frequency switch circuit; and One end of the $i^{th}$ LC parallel resonant loop is connected to the output end of the $(i-1)^{th}$ LC parallel resonant loop, and the other end of the $i^{th}$ LC parallel resonant loop is connected to the input end of the logic control circuit or the input end of the $(i+1)^{th}$ LC parallel resonant loop.

In some embodiments of the disclosure, when i is taken from 2 to M, the resonant point of the $i^{th}$ LC parallel resonant loop is equal to the $i^{th}$ harmonic frequency of the radio frequency switch circuit.

Various embodiments of the disclosure further provide a method for controlling circuit, applied to a radio frequency switch circuit which includes a negative voltage generating circuit, a logic control circuit and a radio frequency switching circuit; in some embodiments the method further includes:

Setting a notch network between the negative voltage generating circuit and the logic control circuit; and Controlling the operating modes of the radio frequency switching circuit by the logic control circuit, upon being driven by the negative voltage signal generated by the negative voltage generating circuit.

In some embodiments of the disclosure, the notch network includes a first LC series resonant loop, and the resonant point of the first LC series resonant loop is set according to the fundamental operating frequency of the radio frequency switch circuit; and one end of the first LC series resonant loop is connected to a common node between the negative voltage generating circuit and the logic control circuit, and the other end of the first LC series resonant loop is grounded.

In some embodiments of the disclosure, the notch network further includes a second LC series resonant loop to an $N^{th}$ LC series resonant loop, where N is an integer greater than or equal to 2; and when i is taken from 2 to N, the resonant point of the $i^{th}$ LC series resonant loop is set according to the $i^{th}$ harmonic frequency of the radio frequency switch circuit; and One end of the $i^{th}$ LC series resonant loop is connected to a common node between the negative voltage generating circuit and the logic control circuit, and the other end of the $i^{th}$ LC series resonant loop is grounded.

In some embodiments of the disclosure, the notch network includes a first LC parallel resonant loop, and the resonant point of the first LC parallel resonant loop is set according to the fundamental operating frequency of the radio frequency switch circuit; and one end of the first LC parallel resonant loop is connected to the input end of the negative voltage generating circuit, and the other end of the first LC parallel resonant loop is connected to the input end of the logic control circuit.

In some embodiments of the disclosure, the notch network further includes a second LC parallel resonant loop to an $M^{th}$ LC parallel resonant loop, where M is an integer greater than or equal to 2; and when i is taken from 2 to M, the resonant point of the $i^{th}$ LC parallel resonant loop is set according to the $i^{th}$ harmonic frequency of the radio frequency switch circuit.

One end of the $i^{th}$ LC parallel resonant loop is connected to the output end of the $(i-1)^{th}$ LC parallel resonant loop, and the other end of the $i^{th}$ LC parallel resonant loop is connected to the input end of the logic control circuit or the input end of the $(i+1)^{th}$ LC parallel resonant loop.

DETAILED DESCRIPTION

The disclosure will be described below in further detail with reference to the drawings and embodiments. It should be understood that the specific embodiments described herein are only used to explain the disclosure, and are not used to limit the disclosure.

A radio frequency switch circuit can switch operating modes between an Antenna (ANT) and a transmitting channel (TX) or a receiving channel (RX) according to actual needs. In order to ensure the signal transmission quality of the radio frequency switch circuit during the operation, high requirements are put forward for the performance such as isolation, insertion loss and harmonic suppression in the range of frequency bands covered by the radio frequency switch circuit.

Radio frequency switch is one of the control devices used to control the transmission path and intensity of radio frequency signals, which is widely used in many fields such as wireless communication, electronic countermeasures, radar systems and electronic measuring instruments.

Figure 1:
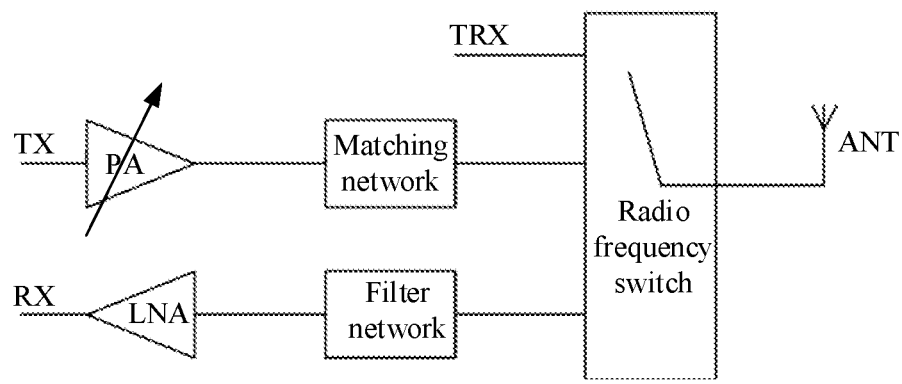
FIG. 1 is a schematic diagram of the functional composition of a radio frequency switch circuit in a radio frequency front-end system according to some embodiments.

FIG. 1 is a schematic diagram of functional components of a radio frequency switch circuit in a radio frequency front-end system according to some embodiments.

FIG. 1 shows the specific connection relationships among a transmitter (TX), a receiver (RX), a Power Amplifier (PA), a Low Noise Amplifier (LNA), a matching network, a filter network, a radio frequency switch and an antenna (ANT), in some embodiments TRX represents other transceiver ports connected to the radio frequency switch.

The TX is connected to the PA and the matching network in turn, and the RX is connected to the LNA and the filter network in turn, and one end of the radio frequency switch is selectively connected to the output end of the matching network or the input end of the filter network, and the other end of the radio frequency switch is connected to the ANT.

It should be noted that the radio frequency switch circuit switches between the ANT and the TX or the RX according to actual needs. For example, the radio frequency switch circuit has different frequency ranges according to the frequency bands in which its connection path is located, therefore, in order to ensure the signal transmission quality during the operation, the radio frequency switch circuit has high requirements on the performance such as isolation, insertion loss and harmonic suppression in the range of frequency bands it covers.

Figure 2:
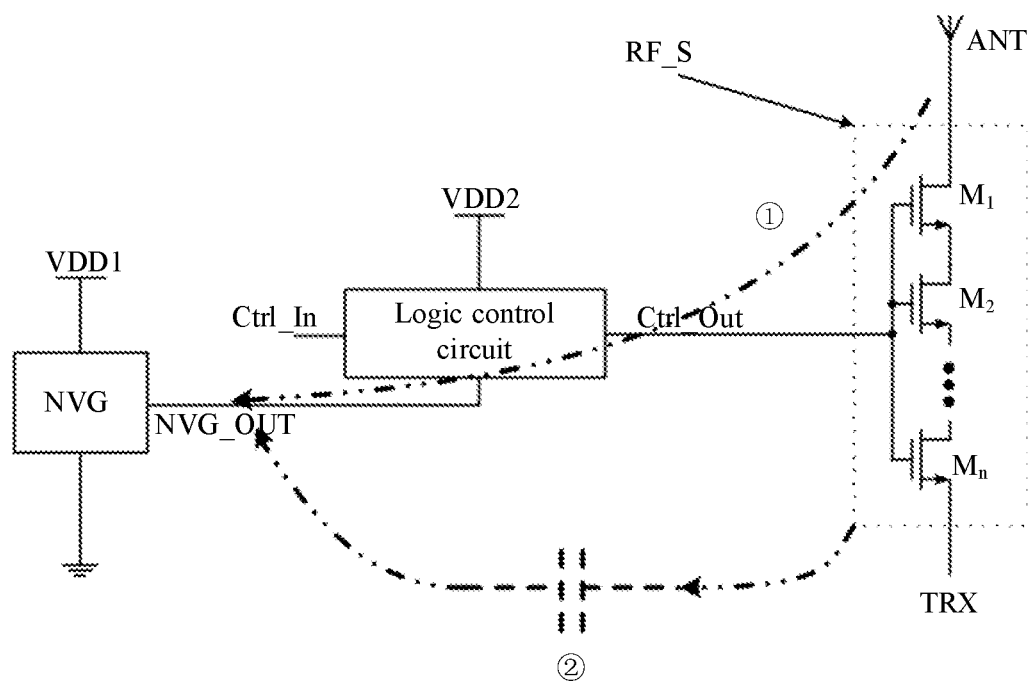
FIG. 2 is a schematic diagram of the structure of a radio frequency switch circuit according to some embodiments.

FIG. 2 is a schematic diagram of the structure of a radio frequency switch circuit. As illustrated in FIG. 2, the specific implementation structure of the radio frequency switch circuit may include: a negative voltage generating circuit (NVG), a logic control circuit and a radio frequency switching circuit RF_S, in some embodiments the NVG is connected between a DC power supply VDD1 and a ground node, and the input signal NVG_OUT at the output end of the NVG is input to the logic control circuit, the power supply end of the logic control circuit is connected to a DC power supply VDD2, and the input end of the logic control circuit is connected to a control signal Ctrl. In, and the output signal Ctrl_OUT of the logic control circuit is input to the radio frequency switching circuit; and the radio frequency switching circuit includes a series branch, in some embodiments the series branch includes N MOS transistors $M_1$-$M_n$, and among the N MOS transistors $M_1$-$M_n$, the drain of the MOS transistor $M_1$ is connected to the ANT, and the source of the $M_1$ is connected to the drain of the $M_2$, and the drain of the MOS transistor $M_n$ is connected to the source of the previous MOS transistor, and the source of the $M_n$ is connected to the TRX, and the gate of each MOS transistor of the N MOS transistors $M_1$-$M_n$ is connected to the signal Ctrl_OUT, and one end of the series branch is connected to the TRX end, and the other end of the series branch is connected to the ANT end.

In some embodiments, among the N MOS transistors $M_1$-$M_n$, the drain of the $i^{th}$ MOS transistor is connected to the source of the $(i-1)^{th}$ MOS transistor, and the source of the $i^{th}$ MOS transistor is connected to the drain of the $(i+1)^{th}$ MOS transistor, in some embodiments i is an integer greater than or equal to 2 and less than N.

In some embodiments, the radio frequency switch circuit is implemented by the MOS transistor, in some embodiments the MOS transistor is a Silicon-On-Insulator MOSFET (SOI MOS transistor), which refers to a field effect transistor with a silicon transistor structure on an insulator.

For example, the output signal Ctrl_OUT of the logic control circuit is used to drive the gate of the MOS transistor. However, in this implementation structure, when the radio frequency switch circuit operates, there is a large swinging amplitude of the radio frequency signal (including a radio frequency voltage and a radio frequency current) at each of the ANT, TRX and internal terminals, in some embodiments the radio frequency signal in the radio frequency switch circuit will be transmitted to the negative voltage generating circuit through two paths.

As illustrated in FIG. 2, the first path and the second path are represented by two dashed lines respectively, in some embodiments the first path (1) represents the leakage of the radio frequency signal caused by the radio frequency switching circuit via the logic control circuit, in some embodiments, the leakage refers to that the large swinging amplitude of the radio frequency signal passing through the MOS transistor will be transmitted to the negative voltage generating circuit via the logic control circuit, and then will affect the voltage at the output end of the negative voltage generating circuit; specifically, when there is a large radio frequency signal amplitude at the output end of the negative voltage generating circuit, it will lead to drifting of the DC operating point of the negative voltage generating circuit, and the direct result therefrom is that the voltage at the output end of the negative voltage generating circuit will shift.

Figure 3A:
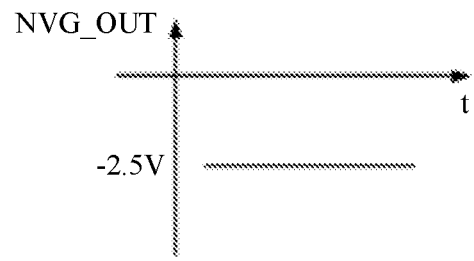
FIG. 3A is a first schematic diagram of the bias voltage at the output end of a negative voltage generating circuit according to some embodiments.
Figure 3B:
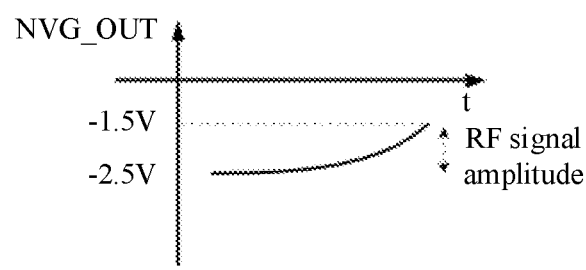
FIG. 3B is a second schematic diagram of the bias voltage at the output end of a negative voltage generating circuit according to some embodiments.

According to some embodiments, FIG. 3A is a first schematic diagram of the bias voltage at the output end of a negative voltage generating circuit according to some embodiments; and FIG. 3B is a second schematic diagram of the bias voltage at the output end of a negative voltage generating circuit according to some embodiments; in some embodiments the horizontal axis in FIGS. 3A and 3B represents time t, and the vertical axis in FIGS. 3A and 3B represents the voltage value in V at the output end of the negative voltage generating circuit.

As can be seen in FIG. 3A, the negative voltage required by the radio frequency switch circuit in a practical application is −2.5V in an ideal case, and it can be seen with reference to FIG. 3B that when there is a large radio frequency (RF) signal amplitude at the output end of the negative voltage generating circuit, the voltage at the output end of the negative voltage generating circuit shifts from the original −2.5V to −1.5V. That is, due to the influence of the swinging amplitude of the radio frequency signal in the radio frequency switch circuit, the negative voltage generating circuit cannot provide a suitable negative voltage bias for a level conversion circuit, in some embodiments the level conversion circuit is included in the logic control circuit; then, the control signal of the MOS transistor in the radio frequency switching circuit is shifted, and finally the performance of the radio frequency switch circuit such as insertion loss and isolation is deteriorated.

With reference to FIG. 2, the second path (2) represents the influence of spatial coupling, and in some cases the distance between the negative voltage generating circuit and radio frequency switching circuit is increased on the layout, and the ground wires of analog circuits such as the negative voltage generating circuit are separated from the ground wires of radio frequency switching circuit, thus reducing the coupling of radio frequency signals via common ground wires, however, these methods will undoubtedly increase the area, limit the arrangement of the layout, and cannot completely reduce the interference of radio frequency signals.

The two paths as mentioned above may induce the interference of radio frequency signals in the radio frequency switch to the negative voltage generating circuit, and then lead to deterioration of the performance of the radio frequency switch circuit.

Various embodiments of the disclosure provide a radio frequency switch circuit and a method for controlling circuit. The radio frequency switch circuit includes a negative voltage generating circuit, a notch network, a logic control circuit and a radio frequency switching circuit, in some embodiments the logic control circuit is configured to, upon being driven by the negative voltage signal generated by the negative voltage generating circuit, control the operating modes of the radio frequency switching circuit; and the notch network is connected between the negative voltage generating circuit and the logic control circuit.

It can be seen that a notch network is added between the negative voltage generating circuit and the logic control circuit; in this way, the influence of radio frequency signals in the radio frequency switching circuit can be filtered by means of the notch network, and the interference of radio frequency signals to the negative voltage generating circuit can be reduced, thereby improving the performance of the radio frequency switch circuit such as insertion loss, isolation and harmonic suppression.

It should be noted that the performance of the radio frequency switch circuit includes switching time, on-state resistance (RON) and off-state capacitance (COFF) in addition to insertion loss, isolation and harmonic suppression, all of which will be improved by the embodiments of the disclosure.

Based on the radio frequency switch circuit and application scenarios as described above, the following embodiments are presented.

Figure 4:
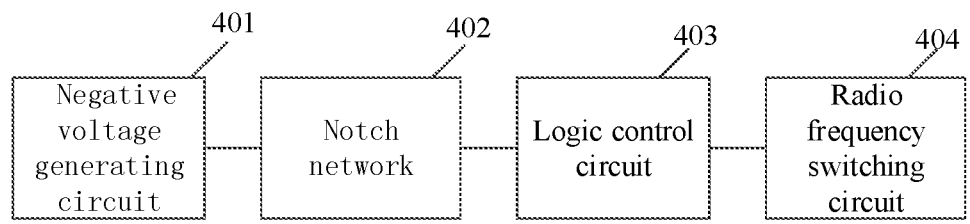
FIG. 4 is a schematic diagram of a radio frequency switch circuit according to some embodiments of the disclosure.

FIG. 4 is a schematic diagram of a radio frequency switch circuit according to some embodiments of the disclosure. As is illustrated in FIG. 4, the radio frequency switch circuit includes a negative voltage generating circuit 401, a notch network 402, a logic control circuit 403 and a radio frequency switching circuit 404; in some embodiments the logic control circuit 403 is configured to, upon being driven by the negative voltage signal generated by the negative voltage generating circuit, control the operating modes of the radio frequency switching circuit 404; and The notch network 402 is connected between the negative voltage generating circuit 401 and the logic control circuit 403.

In some embodiments, the negative voltage generating circuit provides a negative voltage bias for the logic control circuit, in some embodiments the magnitude of the negative voltage bias is set according to actual application situations, for example, to be −2.5V, the embodiments of the disclosure do not make limitation thereto.

In some embodiments, the notch network can attenuate signals with specific frequencies to a certain extent, and the notch network is usually used in circuits to filter out signals with unnecessary frequencies, and the resonance frequency set by the notch network is the signal with the frequency to be filtered out; in order to attenuate the signal with a specific frequency sufficiently, it is common practice to select the order high enough to achieve attenuation with a large extent.

In some embodiments of the disclosure, the notch network includes a first LC series resonant loop, and the resonant point of the first LC series resonant loop is set according to the fundamental operating frequency of the radio frequency switch circuit; and one end of the first LC series resonant loop is connected to a common node between the negative voltage generating circuit and the logic control circuit, and the other end of the first LC series resonant loop is grounded.

In some embodiments, the resonant point of the first LC series resonant loop is equal to the fundamental operating frequency of the radio frequency switch circuit.

In some embodiments of the disclosure, the notch network includes a first LC parallel resonant loop, and the resonant point of the first LC parallel resonant loop is set according to the fundamental operating frequency of the radio frequency switch circuit; and one end of the first LC parallel resonant loop is connected to the output end of the negative voltage generating circuit, and the other end of the first LC parallel resonant loop is connected to the input end of the logic control circuit.

In some embodiments, the resonant point of the first LC parallel resonant loop is equal to the fundamental operating frequency of the radio frequency switch circuit.

It can be seen that the first resonant loop in the notch network can be either an LC series resonant loop or an LC parallel resonant loop, and the embodiments of the disclosure do not make limitation thereto.

In some embodiments, setting the resonance point of the first resonant circuit to the fundamental operating frequency of the radio frequency switch can limit the bias voltage of the negative voltage generating circuit, that is, effectively reduce the influence of the voltage of the output end of the negative voltage generating circuit due to the large swinging amplitude of the radio frequency signal in the radio frequency switching circuit, and improve the performance of the radio frequency switch circuit.

In some embodiments, the notch network further includes a second LC series resonant loop to an $N^{th}$ LC series resonant loop, in some embodiments N is an integer greater than or equal to 2; and when i is taken from 2 to N, the resonance point of the $i^{th}$ LC series resonant loop is set according to the $i^{th}$ harmonic frequency of the radio frequency switch circuit; and one end of the $i^{th}$ LC series resonant loop is connected to a common node between the negative voltage generating circuit and the logic control circuit, and the other end of the $i^{th}$ LC series resonant loop is grounded.

In some embodiments, when i is taken from 2 to N, the resonant point of the $i^{th}$ LC series resonant loop is equal to the $i^{th}$ harmonic frequency of the radio frequency switch circuit.

In some embodiments, the notch network further includes a second LC parallel resonant loop to an $M^{th}$ LC parallel resonant loop, in some embodiments M is an integer greater than or equal to 2; and when i is taken from 2 to M, the resonant point of the $i^{th}$ LC parallel resonant loop is set according to the $i^{th}$ harmonic frequency of the radio frequency switch circuit; and one end of the $i^{th}$ LC parallel resonant loop is connected to the output end of the $(i-1)^{th}$ LC parallel resonant loop, and the other end of the $i^{th}$ LC parallel resonant loop is connected to the input end of the logic control circuit or the input end of the $(i+1)^{th}$ LC parallel resonant loop.

In some embodiments, when i is taken from 2 to M, the resonant point of the $i^{th}$ LC series resonant loop is equal to the $i^{th}$ harmonic frequency of the radio frequency switch circuit.

It can be seen that the $i^{th}$ resonant loop in the notch network can be either a LC series resonant loop or a LC parallel resonant loop, and the embodiments of the disclosure do not make limitation thereto.

In some embodiments, the $i^{th}$ resonant loop can be a LC series resonant loop, and the $(i+1)^{th}$ resonant loop can be a LC parallel resonant loop, and alternatively, the $i^{th}$ resonant loop can be a LC parallel resonant loop, and the $(i+1)^{th}$ resonant loop can be a LC series resonant loop, and the embodiments of the disclosure do not make limitation thereto.

In some embodiments, the structure of the notch network can be a notch network in which capacitors and inductors are connected in series and then connected in parallel to the radio frequency switch circuit, or a notch network in which capacitors and inductors are connected in parallel and then connected in series to the radio frequency switch circuit. The radio frequency switch circuit of the embodiments of the disclosure is also applicable to other structures of notch networks and do not make limitation thereto.

In some embodiments, the resonance point of the first resonant loop is set to the fundamental operating frequency of the radio frequency switch circuit, and the resonance point of the second resonant loop is set to the second harmonic frequency of the radio frequency switch, and the resonance point of the third resonant loop is set to the third harmonic frequency of the radio frequency switch, and by analogy, the resonance point of the resonant loop is set to the harmonic frequency with a higher order, then, the notch network can suppress the influence of the harmonics of radio frequency signals, thereby ensuring that the negative voltage at the output end of the negative voltage generating circuit remains stable and improving the performance of the radio frequency switch circuit.

In some embodiments, the resonant point of the second resonant loop can be set to the fundamental operating frequency of the radio frequency switch circuit, and the resonant point of the third resonant loop can be set to the second harmonic frequency of the radio frequency switch, that is, the embodiments of the disclosure do not make limitation to the corresponding relationship between the resonant loop and the harmonic frequency.

Figure 5:
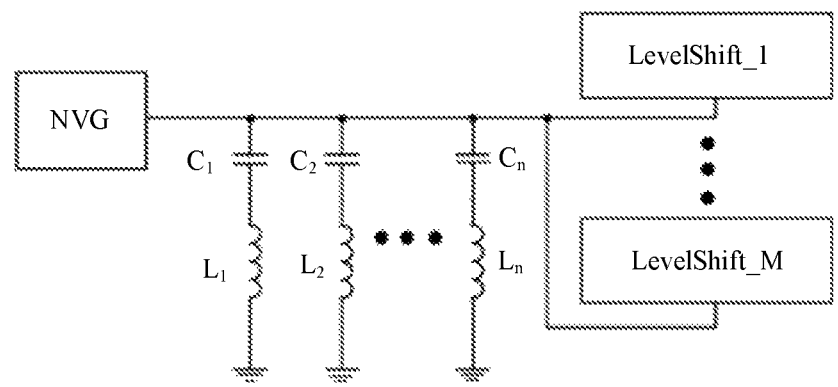
FIG. 5 is a first schematic diagram of the structure of a notch network according to some embodiments of the disclosure.

FIG. 5 is a first schematic diagram of the structure of a notch network according to some embodiments of the disclosure, as illustrated in FIG. 5, the notch network is connected between a NVG and a logic control circuit, in some embodiments, the logic control circuit includes a parallel branch, and in some embodiments the parallel branch includes M level shift units Levelshift_1-Levelshift_M, and M is an integer greater than or equal to 1.

The notch network includes n capacitors $C_1, C_2, \ldots, C_n$ and n inductors $L_1, L_2, \ldots, L_n$, in some embodiments $C_1$ and $L_1$, $C_2$ and $L_2$, $\ldots$, $C_n$ and $L_n$ are connected in series to form resonant circuits respectively, and n is an integer greater than or equal to 1; and one end of each resonant loop is connected to a common node between the NVG and the level shift units LevelShift_1-LevelShift_M, and the other end of each resonant loop is grounded.

Figure 6:
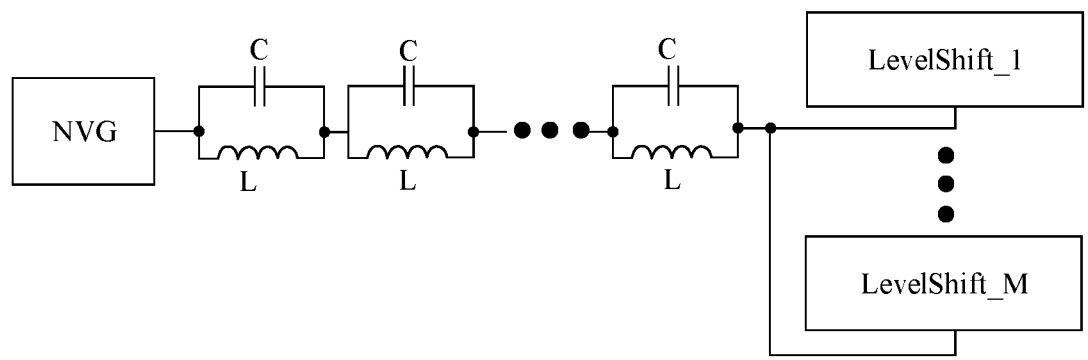
FIG. 6 is a second schematic diagram of the structure of a notch network according to some embodiments of the disclosure.

FIG. 6 is a second schematic diagram of the structure of a notch network according to some embodiments of the disclosure, as illustrated in FIG. 6, the notch network is connected between a NVG and a logic control circuit, in some embodiments, the logic control circuit includes a parallel branch, and in some embodiments the parallel branch includes M level shift units Levelshift_1-Levelshift_M, and M is an integer greater than or equal to 1.

The notch network includes n capacitors C and n inductors L, in some embodiments C and L are connected in parallel to form resonant circuits respectively, and n is an integer greater than or equal to 1; in some embodiments one end of the first resonant circuit is connected to the output end of the negative voltage generating circuit, the other end of the first resonant circuit is connected to the input end of the second resonant circuit, and one end of the $n^{th}$ resonant circuit is connected to the output end of the $(n-1)^{th}$ resonant circuit, and the other end of the $n^{th}$ resonant circuit is connected to the input end of the level shift unit LevelShift_1-LevelShift_M or the input end of the $(n+1)^{th}$ LC parallel resonant circuit.

It should be noted that the notch network illustrated in FIGS. 5 and 6 is only an example of the radio frequency switch circuit of the disclosure; and according to actual situations, the number of inductors and capacitors can be changed with respect to the structure of the notch network of FIGS. 5 and 6, and different inductors and capacitors can be connected in series or in parallel according to actual application requirements, and the embodiments of the disclosure do not make limitation thereto.

In some embodiments, the logic control circuit includes several level shift units, each of which generates a corresponding positive control voltage or negative control voltage; in some embodiments all the level shift units included in the logic control circuit can generate positive control voltages or negative control voltages, and a part of the level shift units can generate positive control voltages and a part of the level shift units can generate negative control voltages, and the specific positive and negative control voltages are determined according to the transmission or reception paths by which the radio frequency switch circuit needs to be turned on in actual applications, and the embodiments of the disclosure do not make limitation thereto.

In some embodiments, when the radio frequency switch circuit operates in a signal transmission mode, the control voltage turns on the radio frequency switch path from the ANT end of the radio frequency switching circuit to the transmission end of the corresponding frequency band, while turning off other radio frequency switch paths; and when the radio frequency switch circuit operates in a signal reception mode, the control voltage turns on the radio frequency switch path from the ANT end of the radio frequency switching circuit to the reception end, while turning off other radio frequency switch paths.

In some embodiments, the logic control circuit is configured to, upon being driven by the negative voltage signal generated by the negative voltage generating circuit, control the operating modes of the radio frequency switching circuit.

In some embodiments, the negative voltage signal is a bias negative voltage generated by the output end of the negative voltage generating circuit, and the operating modes of the radio frequency switching circuit include two modes, i.e., a signal transmission mode and a signal reception mode. The radio frequency switching circuit is controlled by the logic control circuit to switch its operating modes.

Figure 7:
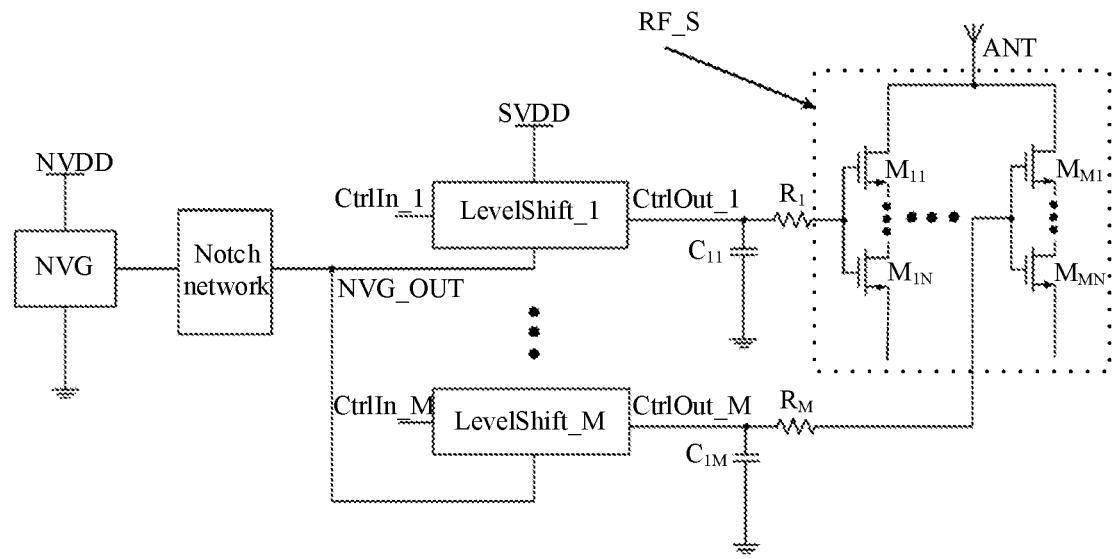
FIG. 7 is a schematic diagram of the structure of a radio frequency switch circuit provided by some embodiments of the disclosure.

FIG. 7 is a schematic diagram of the structure of a radio frequency switch circuit provided by some embodiments of the disclosure, as illustrated in FIG. 7, the radio frequency switch circuit includes a NVG, a notch network, M level shift units LevelShift_1-LevelShift_M and a radio frequency switching circuit RF_S, wherein in some embodiments M is an integer greater than or equal to 1.

In some embodiments, the negative voltage generating circuit is connected between a DC power supply NVDD and a ground node, and the input signal NVG_OUT at the output end of the negative voltage generating circuit is transmitted to M level shift units LevelShift_1-LevelShift_M in the logic control circuit via the notch network, and the M level shift units have M input signals CtrlIn_1-CtrlIn_M and M output signals CtrlOut_1-CtrlOut_M; and each level shift unit is connected between a DC power supply SVDD and the notch network, and the output signal of the level shift unit is transmitted to the gates of N MOS transistors in each series branch of the radio frequency switching circuit RF_S via a RC filter circuit.

In some embodiments, the first level shift unit LevelShift_1 is connected to a $R_1C_{11}$ filter circuit, and transmits the output signal CtrlOut_1 to N MOS transistors $M_1$-$M_n$ in the first series branch of the radio frequency switching circuit; in some embodiments, the RICH filter circuit refers to a circuit including a resistor $R_1$ and a capacitor $C_{11}$.

In some embodiments, the $M^{th}$ level shift unit LevelShift_M is connected to a $R_MC_{1M}$ filter circuit, and transmits the output signal CtrlOut_M to N MOS transistors $M_{M1}$-$M_{Mn}$ in the $M^{th}$ series branch of the radio frequency switching circuit; in some embodiments, the $R_MC_{1M}$ filter circuit refers to a circuit including a resistor $R_M$ and a capacitor $C_{1M}$.

In some embodiments, the radio frequency switching circuit RF_S includes M branches, taking the first branch as an example, it includes a series branch including N MOS transistors $M_{11}$-$M_{1N}$, one end of the series branch is connected to a TRX port and the other end of the series branch is connected to an ANT port, and the gate of each MOS transistor in the series branch is driven by the control voltage output by the same level shift unit.

In some embodiments, the specific number N of MOS transistors in series in M branches of the radio frequency switching circuit is determined by actual application scenarios, and the embodiments of the disclosure do not make limitation thereto, M is an integer greater than or equal to 1, and N is an integer greater than or equal to 1.

In some embodiments, the gates of N MOS transistors in different series branches of the radio frequency switching circuit are driven by the output control voltages of different level shift units.

In some embodiments, the first series branch $M_{11}$-$M_{1N}$ of the radio frequency switching circuit is driven by the control voltage CtrlOut_1 output by the first level shift unit LevelShift_1, and the second series branch $M_{21}$-$M_{2N}$ of the radio frequency switching circuit is driven by the control voltage CtrlOut_2 output by the second level shift unit LevelShift_2, and by analogy, the $M^{th}$ branch $M_{M1}$-$M_{MN}$ of the radio frequency switching circuit is driven by the control voltage CtrlOut_M output by the $M^{th}$ level shift unit LevelShift_M.

In some embodiments, when the radio frequency switch circuit operates in a signal transmission or reception mode, the NVG generates a negative voltage to provide a negative voltage bias for each level shift unit, and each level shift unit generates a corresponding positive control voltage or negative control voltage CtrlOut_1-CtrlOut_M, in some embodiments M is an integer greater than or equal to 1.

It can be seen that the negative voltage generating circuit is used to provide a negative voltage bias for the level shift unit; and that the notch network is used to filter the influence of radio frequency signals in the radio frequency switching circuit on the negative voltage generating circuit; and that each level shift unit is used to generate a control voltage according to the negative voltage bias provided by the negative voltage generating circuit, to drive the radio frequency switching circuit to switch the operating modes. In this way, by adding a notch network between the negative voltage generating circuit and the logic control circuit, the influence of radio frequency signals in the radio frequency switching circuit on the negative voltage generating circuit can be filtered by means of the notch network, and the interference of radio frequency signals to the negative voltage generating circuit can be reduced, thereby improving the performance of the radio frequency switch circuit such as insertion loss, isolation and harmonic suppression.

In order to better illustrate the purpose of the disclosure, further examples are given and explained based on the above embodiments of the disclosure.

Figure 8:
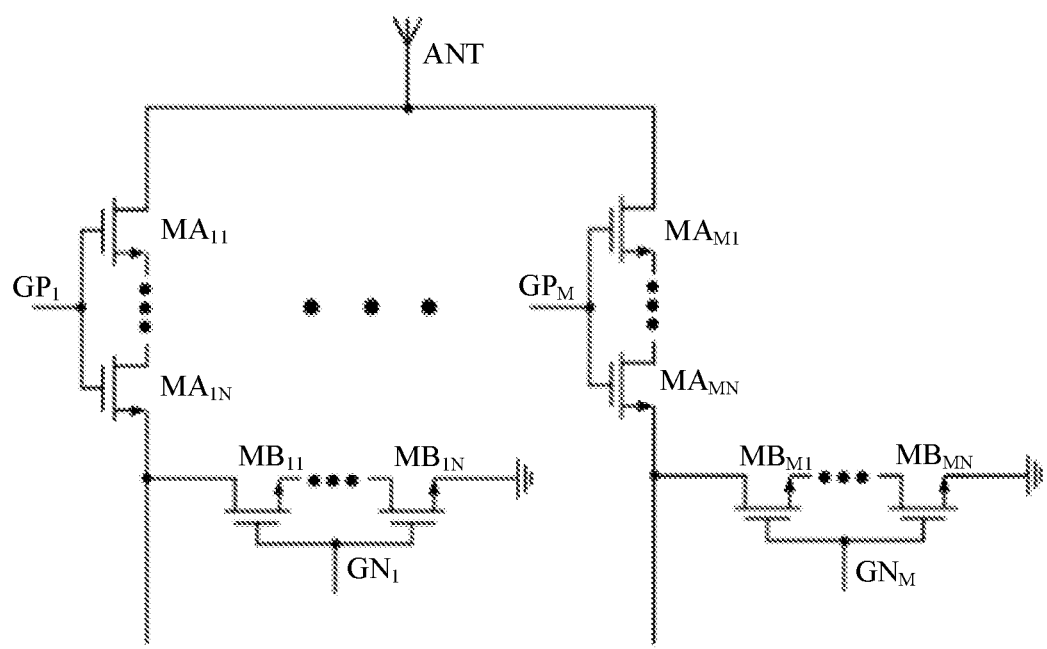
FIG. 8 is a circuit structural diagram of a radio frequency switching circuit that can use a notch network provided by some embodiments of the disclosure.

FIG. 8 is a circuit structural diagram of a radio frequency switching circuit that can use a notch network provided by some embodiments of the disclosure, as illustrated in FIG. 8, there are M branches from an ANT end to a TRX end in the radio frequency switching circuit, taking the first branch as an example, it includes one series branch and one parallel branch. In some embodiments the series branch including N MOS transistors $MA_{11}$-$MA_{1N}$, and among the N MOS transistors $MA_{11}$-$MA_{1N}$, the drain of the MOS transistor $MA_{11}$ is connected to the ANT, and the source of the $MA_{11}$ is connected to the drain of the $MA_{12}$, and the drain of the MOS transistor MA1N is connected to the source of the previous MOS transistor, and the source of the MA1N is connected to the TRX, and the gate of each MOS transistor in the N MOS transistors $MA_{11}$-$MA_{1N}$ is connected to a signal $GP_1$.

In some embodiments the parallel branch includes N MOS transistors $MB_{11}$-$MB_{1N}$, and among the N MOS transistors $MB_{11}$-$MB_{1N}$, the drain of the MOS transistor $MB_{11}$ is connected to the source of the MA1N, and the source of the $MB_{11}$ is connected to the drain of the $MB_{12}$, and the drain of the MOS transistor $MB_{1N}$ is connected to the source of the previous MOS transistor, and the source of the $MB_{1N}$ is grounded, and the gate of each MOS transistor in the N MOS transistors $MB_{11}$-$MB_{1N}$ is connected to a signal $GN_1$.

Taking the $M^{th}$ branch as an example, it includes one series branch and one parallel branch, in some embodiments the series branch includes N MOS transistor $MA_{M1}$-$MA_{MN}$, and the drain of the MOS transistor $MA_{M1}$ is connected to the ANT, and the source of the $MA_{M1}$ is connected to the drain of the $MA_{M2}$, and the drain of the MOS transistor $MA_{MN}$ is connected to the source of previous MOS transistor, and the source of the $MA_{MN}$ is connected to the TRX, and the gate of each MOS transistor in the N MOS transistors $MA_{M1}$-$MA_{MN}$ is connected to a signal $GP_M$.

In some embodiments, the parallel branch includes N MOS transistors $MB_{M1}$-$MB_{MN}$, and among the N MOS transistors $MB_{M1}$-$MB_{MN}$, the drain of the MOS transistor $MB_{M1}$ is connected to the source of the $MA_{MN}$, and the source of the $MB_{M1}$ is connected to the drain of the $MB_{M2}$, and the drain of the MOS transistor $MB_{MN}$ is connected to the source of the previous MOS transistor, and the source of the $MB_{MN}$ is grounded, and the gate of each MOS transistor in the N MOS transistors $MB_{M1}$-$MB_{MN}$ is connected to a signal $GN_M$.

It can be seen that one end of the series branch in the radio frequency switching circuit is connected to a TRX interface, and the other end of the series branch is connected to an ANT interface, and the parallel branch includes N MOS transistors $MB_{11}$-$MB_{1N}$, and one end of the parallel branch is connected to the same TRX interface as the series branch being connected to, and the other end of the parallel branch is grounded. In some embodiments the gate GP of the MOS transistor in the series branch and the gate GN of the MOS transistor in the parallel branch are driven by different output levels of the same level shift unit, and when one of the output levels is at a high level, the other of the output levels is kept at a low level.

Figure 9:
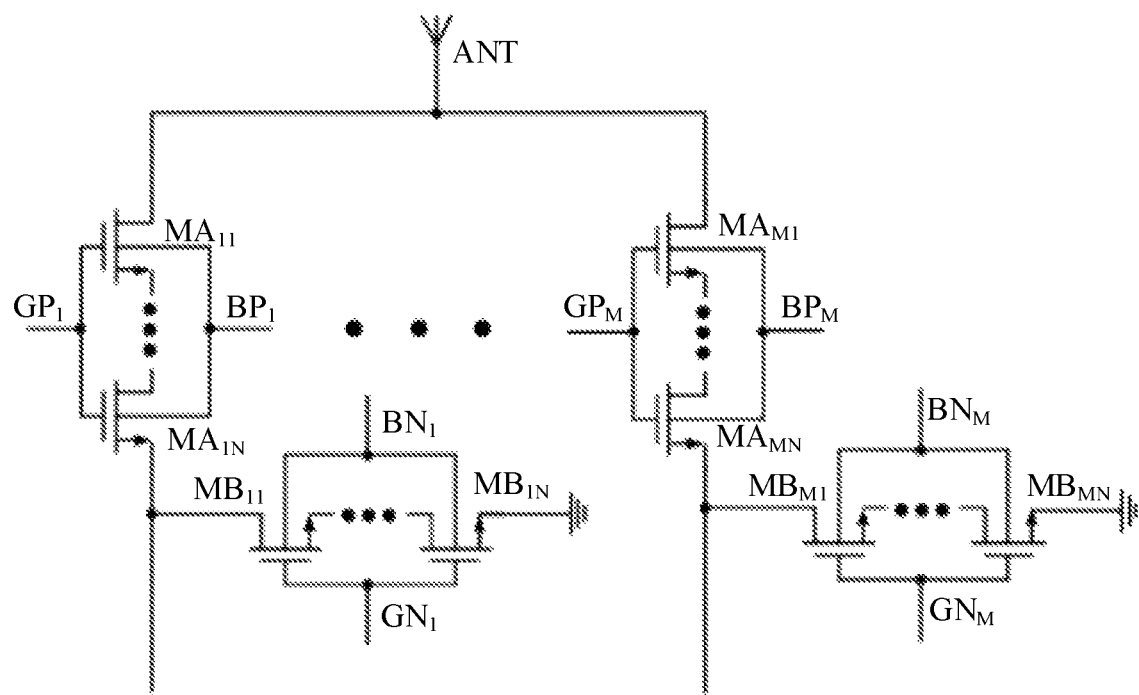
FIG. 9 is a circuit structural diagram of another radio frequency switching circuit that can use a notch network provided by some embodiments of the disclosure.

Furthermore, FIG. 9 is a circuit structural diagram of another radio frequency switching circuit that can use a notch network provided by some embodiments of the disclosure, as illustrated in FIG. 9, there are M branches from an ANT end to a TRX end in the radio frequency switching circuit, taking the first branch as an example, it includes one series branch and one parallel branch.

In some embodiments the series branch includes N MOS transistors $MA_{11}$-$MA_{1N}$, and among the N MOS transistors $MA_{11}$-$MA_{1N}$, the drain of the MOS transistor $MA_{11}$ is connected to the ANT, and the source of the $MA_{11}$ is connected to the drain of the $MA_{12}$, and the drain of the MOS transistor MA1N is connected to the source of the previous MOS transistor, and the source of the MAIN is connected to the TRX, and the gate and the substrate of each MOS transistor in the N MOS transistors $MA_{11}$-$MA_{1N}$ are connected to signals $GP_1$ and $BP_1$ respectively.

In some embodiments the parallel branch includes N MOS transistors $MB_{11}$-$MB_{1N}$, and among the N MOS transistors $MB_{11}$-$MB_{1N}$, the drain of the MOS transistor $MB_{11}$ is connected to the source of the MAIN, and the source of the $MB_{11}$ is connected to the drain of the $MB_{12}$, and the drain of the MOS transistor $MB_{1N}$ is connected to the source of the previous MOS transistor, and the source of the $MB_{1N}$ is grounded, and the gate and the substrate of each MOS transistor in the N MOS transistors $MB_{11}$-$MB_{1N}$ are connected to signals $GN_1$ and $BN_1$ respectively.

Taking the $M^{th}$ branch as an example, it includes one series branch and one parallel branch, in some embodiments the series branch includes N MOS transistor $MA_{M1}$-$MA_{MN}$, and among the N MOS transistor $MA_{M1}$-$MA_{MN}$, the drain of the MOS transistor $MA_{M1}$ is connected to the ANT, and the source of the $MA_{M1}$ is connected to the drain of the $MA_{M2}$, and the drain of the MOS transistor $MA_{MN}$ is connected to the source of previous MOS transistor, and the source of the $MA_{MN}$ is connected to the TRX, and the gate and the substrate of each MOS transistor in the N MOS transistors $MA_{M1}$ $MA_{MN}$ are connected to signals $GP_M$ and $BP_M$ respectively.

In some embodiments the parallel branch includes N MOS transistors $MB_{M1}$ $MB_{MN}$, and among the N MOS transistors $MB_{M1}$-$MB_{MN}$, the drain of the MOS transistor $MB_{M1}$ is connected to the source of the $MA_{MN}$, and the source of the $MB_{M1}$ is connected to the drain of the $MB_{M2}$, and the drain of the MOS transistor $MB_{MN}$ is connected to the source of the previous MOS transistor, and the source of the $MB_{MN}$ is grounded, and the gate and the substrate of each MOS transistor in the N MOS transistors $MB_{M1}$-$MB_{MN}$ are connected to signals $GN_M$ and $BN_M$ respectively.

It can be seen that one end of the series branch in the radio frequency switching circuit is connected to a TRX interface, the other end of the series branch is connected to an ANT interface, and the parallel branch includes N MOS transistors $MB_{11}$-$MB_{1N}$, one end of the parallel branch is connected to the same TRX interface as the series branch being connected to, and the other end of the parallel branch is grounded. In some embodiments the gate GP and substrate BP of the MOS transistor in the series branch as well as the gate GN and substrate BN of the MOS transistor in the parallel branch are driven by different output levels of the same level shift unit, and the parallel branch is kept to be turned off when the series branch is turned on, or the parallel branch is kept to be turned on when the series branch is turned off.

It should be noted that the circuit structural diagram of the radio frequency switching circuit proposed in some embodiments of the disclosure is not limited to the circuit structures described in the above-mentioned FIGS. 7-9 only, but is also applicable to the circuit structures of other radio frequency switching circuits, and the embodiments of the disclosure do not make limitation thereto.

Various embodiments of the disclosure therefore provide a radio frequency switch circuit and a method for controlling circuit, and the radio frequency switch circuit includes a negative voltage generating circuit, a notch network, a logic control circuit and a radio frequency switching circuit; in some embodiments the logic control circuit is configured to, upon being driven by the negative voltage signal generated by the negative voltage generating circuit, control the operating modes of the radio frequency switching circuit; and the notch network is connected between the negative voltage generating circuit and the logic control circuit.

Advantageously, the influence of radio frequency signals generated by the radio frequency switching circuit can be filtered by means of the notch network, and the interference of radio frequency signals to the negative voltage generating circuit can be reduced, thereby improving the performance of the radio frequency switch circuit such as insertion loss, isolation and harmonic suppression.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A radio frequency switch circuit, comprising:
a negative voltage generating circuit;
a notch network;
a logic control circuit; and
a radio frequency switching circuit;
wherein
the logic control circuit is configured to, upon being driven by the negative voltage signal generated by the negative voltage generating circuit, control operating modes of the radio frequency switching circuit;
the notch network is connected between the negative voltage generating circuit and the logic control circuit;
the notch network comprises a first LC series resonant loop, and a resonant point of the first LC series resonant loop is set according to the fundamental operating frequency of the radio frequency switch circuit; and
one end of the first LC series resonant loop is connected to a common node between the negative voltage generating circuit and the logic control circuit, and the other end of the first LC series resonant loop is grounded.

2. The radio frequency switch circuit of claim 1, wherein the resonant point of the first LC series resonant loop is equal to the fundamental operating frequency of the radio frequency switch circuit.

3. The radio frequency switch circuit of claim 1, wherein the notch network further comprises a second LC series resonant loop to an $N^{th}$ LC series resonant loop, where N is an integer greater than or equal to 2; and when i is taken from 2 to N, the resonant point of the $i^{th}$ LC series resonant loop is set according to the $i^{th}$ harmonic frequency of the radio frequency switch circuit; and one end of the $i^{th}$ LC series resonant loop is connected to a common node between the negative voltage generating circuit and the logic control circuit, and the other end of the $i^{th}$ LC series resonant loop is grounded.

4. A communication system comprising a radio frequency front-end system comprising the radio frequency switch circuit according to claim 1, further comprising a transmitter (TX), a receiver (RX), a Power Amplifier (PA), a Low Noise Amplifier (LNA), a matching network, a filter network, and an antenna (ANT), wherein the notch network is configured to filter out influence of radio frequency signals generated by the radio frequency switching circuit, and reduce interference of radio frequency signals to the negative voltage generating circuit, thereby improving performance of the radio frequency switch circuit in insertion loss, isolation and harmonic suppression.

5. A radio frequency switch circuit, comprising:
a negative voltage generating circuit;
a notch network;
a logic control circuit; and
a radio frequency switching circuit;
wherein
the logic control circuit is configured to, upon being driven by the negative voltage signal generated by the negative voltage generating circuit, control operating modes of the radio frequency switching circuit;
the notch network is connected between the negative voltage generating circuit and the logic control circuit;
the notch network comprises a first LC parallel resonant loop, and the resonant point of the first LC parallel resonant loop is set according to the fundamental operating frequency of the radio frequency switch circuit; and
one end of the first LC parallel resonant loop is connected to the output end of the negative voltage generating circuit, and the other end of the first LC parallel resonant loop is connected to the input end of the logic control circuit.

6. The radio frequency switch circuit of claim 5, wherein the resonant point of the first LC parallel resonant loop is equal to the fundamental operating frequency of the radio frequency switch circuit.

7. The radio frequency switch circuit of claim 3, wherein when i is taken from 2 to N, the resonant point of the $i^{th}$ LC series resonant loop is equal to the $i^{th}$ harmonic frequency of the radio frequency switch circuit.

8. The radio frequency switch circuit of claim 5, wherein the notch network further comprises a second LC parallel resonant loop to an $M^{th}$ LC parallel resonant loop, where M is an integer greater than or equal to 2; and when i is taken from 2 to M, the resonant point of the $i^{th}$ LC parallel resonant loop is set according to the $i^{th}$ harmonic frequency of the radio frequency switch circuit; and one end of the $i^{th}$ LC parallel resonant loop is connected to the output end of the $(i-1)^{th}$ LC parallel resonant loop, and the other end of the $i^{th}$ LC parallel resonant loop is connected to the input end of the logic control circuit or the input end of the $(i+1)^{th}$ LC parallel resonant loop.

9. The radio frequency switch circuit of claim 8, wherein when i is taken from 2 to M, the resonant point of the $i^{th}$ LC parallel resonant loop is equal to the $i^{th}$ harmonic frequency of the radio frequency switch circuit.

10. A method for controlling circuit, applied to a radio frequency switch circuit having a negative voltage generating circuit, a logic control circuit and a radio frequency switching circuit, wherein the method further comprises:
setting a notch network between the negative voltage generating circuit and the logic control circuit; and
controlling operating modes of the radio frequency switching circuit by the logic control circuit, upon being driven by the negative voltage signal generated by the negative voltage generating circuit;
wherein
the notch network comprises a first LC series resonant loop, and a resonant point of the first LC series resonant loop is set according to the fundamental operating frequency of the radio frequency switch circuit; and
one end of the first LC series resonant loop is connected to a common node between the negative voltage generating circuit and the logic control circuit, and the other end of the first LC series resonant loop is grounded.

11. The method of claim 10, wherein the resonant point of the first LC series resonant loop is equal to the fundamental operating frequency of the radio frequency switch circuit.

12. The method of claim 10, wherein
the notch network comprises a first LC parallel resonant loop, and the resonant point of the first LC parallel resonant loop is set according to the fundamental operating frequency of the radio frequency switch circuit; and
one end of the first LC parallel resonant loop is connected to the output end of the negative voltage generating circuit, and the other end of the first LC parallel resonant loop is connected to the input end of the logic control circuit.

13. The method of claim 12, wherein the resonant point of the first LC parallel resonant loop is equal to the fundamental operating frequency of the radio frequency switch circuit.

14. The method of claim 12, wherein
the notch network further comprises a second LC parallel resonant loop to an $M^{th}$ LC parallel resonant loop, where M is an integer greater than or equal to 2; and when i is taken from 2 to M, the resonant point of the $i^{th}$ LC parallel resonant loop is set according to the $i^{th}$ harmonic frequency of the radio frequency switch circuit; and
one end of the $i^{th}$ LC parallel resonant loop is connected to the output end of the $(i-1)^{th}$ LC parallel resonant loop, and the other end of the $i^{th}$ LC parallel resonant loop is connected to the input end of the logic control circuit or the input end of the $(i+1)^{th}$ LC parallel resonant loop.

15. The method of claim 14, wherein when i is taken from 2 to M, the resonant point of the $i^{th}$ LC parallel resonant loop is equal to the $i^{th}$ harmonic frequency of the radio frequency switch circuit.

16. The method of claim 15, wherein the notch network is configured to filter out influence of radio frequency signals generated by the radio frequency switching circuit, and reduce interference of radio frequency signals to the negative voltage generating circuit, thereby improving performance of the radio frequency switch circuit in insertion loss, isolation and harmonic suppression.

17. The method of claim 10, wherein the notch network further comprises a second LC series resonant loop to an $N^{th}$ LC series resonant loop, where N is an integer greater than or equal to 2; and when i is taken from 2 to N, the resonant point of the $i^{th}$ LC series resonant loop is set according to the $i^{th}$ harmonic frequency of the radio frequency switch circuit; and one end of the $i^{th}$ LC series resonant loop is connected to a common node between the negative voltage generating circuit and the logic control circuit, and the other end of the $i^{th}$ LC series resonant loop is grounded.

18. The method of claim 17, wherein when i is taken from 2 to N, the resonant point of the $i^{th}$ LC series resonant loop is equal to the $i^{th}$ harmonic frequency of the radio frequency switch circuit.

* * * * *